United States Patent [19]

Conway et al.

[11] Patent Number: 4,504,791
[45] Date of Patent: Mar. 12, 1985

[54] SAMPLING FREQUENCY CONVERTER

[75] Inventors: Larry J. Conway, Kanata; Trevor W. Tucker, Ottawa; Sylvain L. Bouchard, Gatineau, all of Canada

[73] Assignee: Her Majesty the Queen in right of Canada, as represented by Minister of National Defence of Her Majesty's Canadian Government, Ottawa, Canada

[21] Appl. No.: 415,618

[22] Filed: Sep. 7, 1982

[30] Foreign Application Priority Data

Oct. 2, 1981 [CA] Canada .................................... 387202

[51] Int. Cl.³ .............................................. G11C 19/28
[52] U.S. Cl. .................................... 328/15; 307/219.1; 307/271; 307/529; 328/25; 328/56; 377/57
[58] Field of Search ...................... 307/219.1, 525, 523, 307/529, 265, 267, 271; 328/15, 20, 25, 56, 58; 333/165, 166; 377/57

[56] References Cited

U.S. PATENT DOCUMENTS

| 3,305,785 | 2/1967 | Carroll, Jr. ............................ 328/56 |
| 3,843,926 | 10/1974 | Espenlaub et al. ............ 324/77 A X |
| 4,117,409 | 9/1978 | O'Brien ............................. 328/56 X |
| 4,173,003 | 10/1979 | Thies .................................... 333/165 |
| 4,370,572 | 1/1983 | Cosand et al. ....................... 307/353 |
| 4,393,357 | 7/1983 | Linnenbrink et al. .............. 333/165 |

Primary Examiner—Stanley D. Miller
Assistant Examiner—D. R. Hudspeth
Attorney, Agent, or Firm—Anthony T. Lane; Jeremiah G. Murray; Robert A. Maikis

[57] ABSTRACT

A method and apparatus for frequency conversion comprising sampling an input signal having a first frequency with first time delays between samples in an input delay line, and distributing the samples of the input signal in sequence to an output delay line with different time delays between samples than the first time delays, to generate an output signal of different frequency than the input signal.

11 Claims, 7 Drawing Figures

SAMPLING FREQUENCY CONVERTER

This invention relates to frequency conversion circuits, and particularly to a novel structure and method for changing the frequency or phase of an input radio frequency signal.

BACKGROUND OF INVENTION

The conversion of radio frequency signals to higher or lower frequencies has been done in the past in one of two ways: mixing an input radio frequency signal with a local oscillator signal, thereby obtaining sum and difference signals (heterodyning), or using electrically non-linear devices, thereby generating harmonic or sub-harmonic signals.

A problem inherent in the heterodyne conversion technique using a local oscillator signal is that the absolute bandwidth remains unchanged, and the fractional bandwidth increases. For instance, an input signal frequency band of $(f_2-f_1)$ with center frequency $f_0$ will retain the same bandwidth even though the center frequency has been reduced by n to $f_0/n$ or increased by n to $nf_0$. In the down conversion process, the ultimate instantaneous bandwidth is clearly limited.

A problem which is inherent in the non-linear device conversion technique is that the converted signal can only be an integral multiple or sub-multiple of the input frequency.

Also, both heterodyning and harmonic/sub-harmonic conversion are non-linear processes which create undesirable harmonic signals and intermodulation products of multiple input signals.

SUMMARY OF THE INVENTION

The present invention is directed to a novel way of converting radio frequency signals to different frequencies. The frequency conversion is very wideband, and the technique is capable of converting signals over an infinite number of conversion factors. The structure is linear, thus allowing a multitude of signals to be processed simultaneously without the generation of intermodulation products. While the circuit is primarily intended to operate with pulse signals, it can also operate with analog or continuous signals if a phase discontinuity can be tolerated or is desired (as when the circuit is used to phase code modulate a signal).

The present invention utilizes the concept of distributed sampling. An input signal is converted by sampling the voltage or its waveform distributed along a delay line, at a number of tap locations along the delay line. The sampled voltages are subsequently amplified by amplifier circuits, and the amplified voltage samples are applied to second tap locations distributed along an output delay line which has a delay time unlike the input delay line. For example, the time between tap locations of the output delay line could be longer than the time delay between tap locations of the input delay line. The input samples are applied to the output delay line at times equal to the delay between output delay line tap locations. An output signal is formed in the output delay line which corresponds to the form of the input signal, but is downconverted in frequency.

Similarly, the delay between tap locations of the output delay line can be shorter than the time between taps of the input delay line, and the resulting output signal frequency will be higher than that of the input signal. The resulting output signal will propagate along the delay line to an output terminal.

In general, the invention is a method of frequency conversion comprising sampling an input signal having a first frequency with first time delays between samples, and distributing the samples of the input signal in sequence with different time delays between samples than the first time delays, to generate an output signal of different frequency than the input signal.

The invention is also a signal frequency converter comprising an input delay line for carrying an input signal, a sampling circuit for sampling the input signal at first predetermined tap locations of the input delay line at first predetermined times, an output delay line having a plurality of second predetermined tap locations with different delay times between taps than the input delay line, and a second sampling circuit for applying the samples of the input signals to the second predetermined tap locations at second predetermined times. As a result, an output signal is generated in the output delay line having a frequency different from the frequency of the input signal.

The sampling times for the output delay line should be at intervals defined by the delay of the output delay line for continuous signals and pulse signals.

A better understanding of the invention will be obtained with reference to the detailed description below, in conjunction with the following drawings.

DESCRIPTION OF THE PREFERRED EMBODIMENTS

Figure 1:
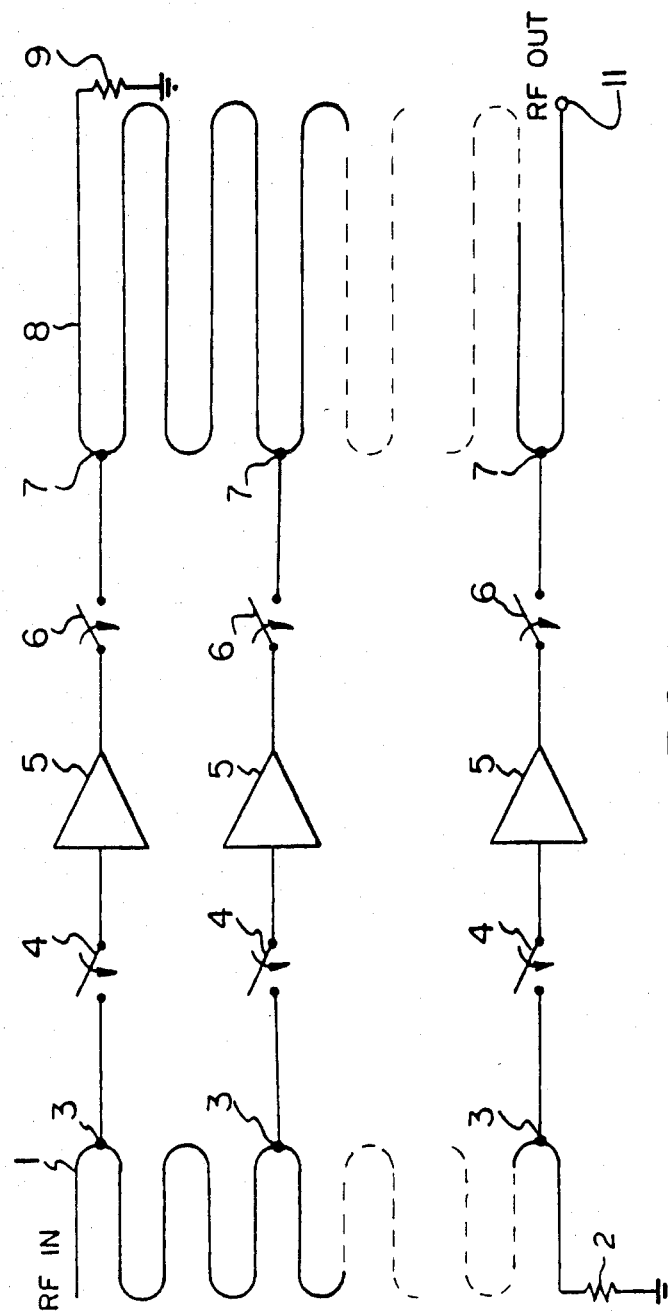
FIG. 1 is a block diagram illustrating one embodiment of the invention.

Turning first to FIG. 1, a radio frequency signal is applied to an input delay line 1, which is terminated by resistor 2. The input delay line has a plurality of first tap locations 3, from which samples of the input signal are obtained. A plurality of gates 4 are each connected so as to apply voltage samples of the input signal carried by the input delay line 1 and apply them to amplifiers 5. Amplifiers 5 may also contain temporary storage means, such as capacitors on which the stored voltage samples are held.

The outputs of amplifiers 5 are connected via output sampling gates 6 to second tap locations 7 distributed along an output delay line 8, which is terminated by resistor 9.

It may be seen that the input samples are applied via output sampling gates 6 to the second tap locations of output delay line 8, where the input signal is reconstructed.

If the output delay line were identical to the input delay line, there would be no change in frequency. This is described in copending U.S. patent application Ser. No. 169,725, now U.S. Pat. No. 4,359,690, filed July 17, 1980 by the same inventors as in the present application, entitled MICROWAVE STORAGE DEVICE.

However, in accordance with the present invention the output delay line 8 has a different delay characteristic than the input delay line 1. In the block diagram shown in FIG. 1, the output delay line has longer delay periods between second tap locations 7 than does the input delay line 1 between first tap locations 3. When the output delay line 8 reconstructs the input signal, in this case the frequency of the output signal is downconverted.

If the delay periods between second tap locations 7 are shorter than those between first tap locations 3, the frequency of the output signal is upconverted.

In order to create a continuous output signal in the output delay line, the output sampling gate sampling frequency should be the inverse of the delay time of the output delay line.

As an example, if the input delay line has a specified time delay between successive tap locations, and the output delay line has a specified time delay between successive tap locations which is twice that of the input delay line then a down-conversion by two is obtained. Since the output delay is doubled, it is not necessary to sample the input signal more than one-half the time, since once the input has been sampled and the samples have been stored, these samples are themselves only sampled at twice the input delay time of the input delay line. Thus the input delay line need only be sampled at the output delay line rate.

Figure 2:
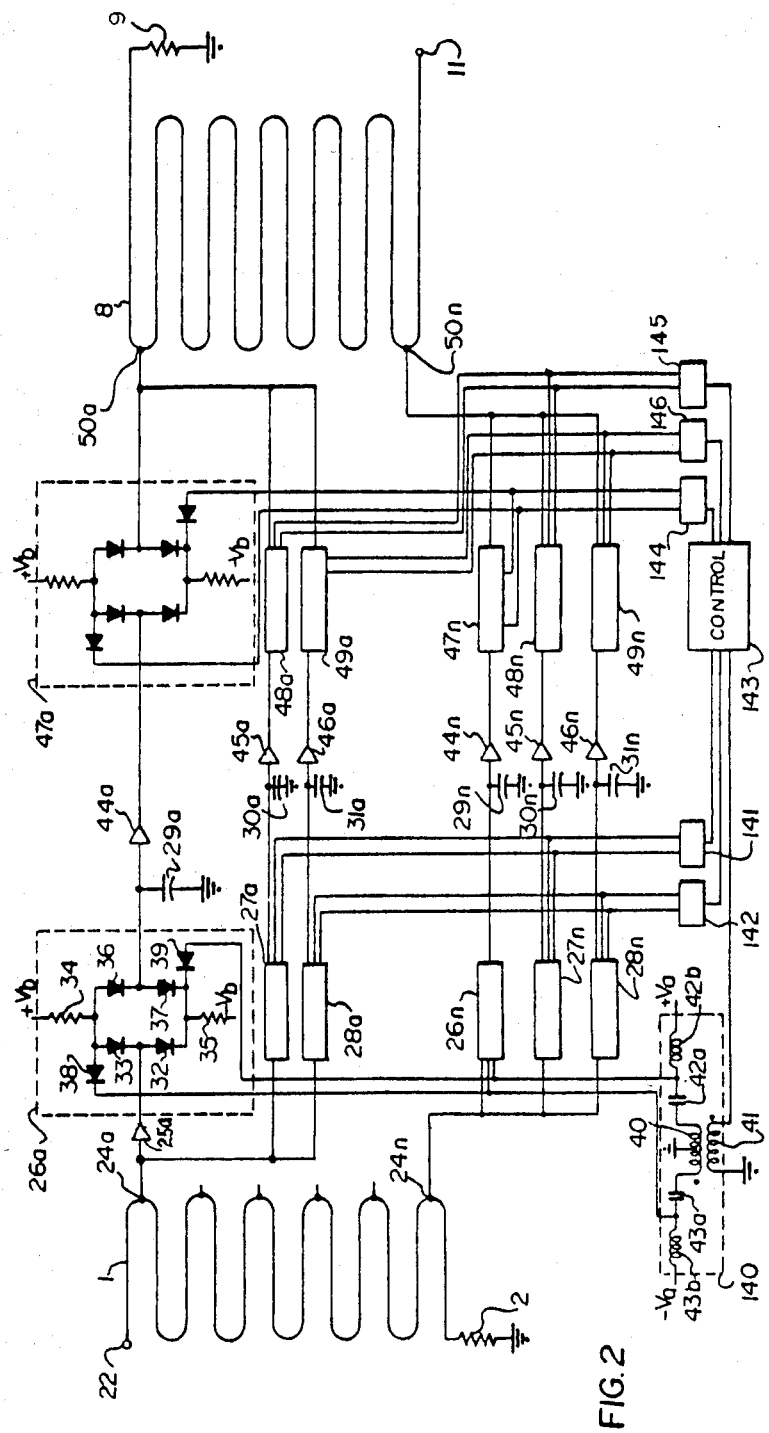
FIG. 2 is a schematic diagram illustrating one embodiment of the invention.

FIG. 2 shows a detailed schematic of the embodiment of the invention. Input delay line 1 has an input terminal 22 and is connected to a load 2, as in FIG. 1. Representative sampling points 24a and 24n are shown as the first and last in the delay line. The sampling points are connected to the inputs of individual samplers and switches as follows.

As described in the aforenoted patent application, each sample is temporarily stored in a storage location before being switched to an output delay line tap. However, when the input pulse length is longer than the input delay line length, multiple storage locations per sampling point (tap) are required.

In the case in which only a single memory storage location per sampling point is required (i.e. the input pulse length does not exceed the input delay line length), each tap point is connected to the input of a corresponding sampler and switching circuit 26a-26n. However, where a plurality of storage locations for each sampling point is required, additional sampler and switching circuits 27a-27n, 28a-28n, etc. are used. The inputs of all of samplers 26a, 27a, and 28a are connected to the tap point 24a, the inputs of all of the samplers 26b, 27b, 28b (not shown) are connected to the tap point 24b (not shown), etc. and the inputs of sampler and switching circuits 26n, 27n, and 28n are all connected to the tap point 24n.

The output of each sampler and switching circuit 26a, 27a, 28a is connected to an individual capacitor 29a, 30a and 31a respectively, etc., and the output of each sampler and switching circuit 26n, 27n, and 28n is connected to an individual capacitor 29n, 30n and 31n respectively. Each of the capacitors forms a storage location for the signal potential which is switched to it.

Each capacitor is connected to the high impedance input of a buffer amplifier 44a-44n, 45a-45n, 46a-46n, and as will be described later, the charge on each capacitor is thus retained as long as the circuits connected thereto are also high impedance.

A representative sampler and switching circuit is shown in the dashed outline block 26a. The output of buffer amplifier 25a is connected to the junction of a pair of series connected diodes 32 and 33 which are poled in the same direction. The anode of diode 33 is connected to a potential source $+V_b$ through a resistor 34, and diode 32 is connected to a source of potential $-V_b$ through a resistor 35. A pair of series connected similarly poled diodes 36 and 37 are also connected in the forward conducting direction between the potential source $+V_b$ and $-V_b$. The junction of diodes 36 and 37 is connected to the input of buffer 44a.

The aforenoted circuit forms a sampler which is connected to a switching circuit comprised of a pair of diodes 38 and 39. The anode of diode 38 is connected to the anodes of diodes 33 and 36, and the cathode of diode 39 is connected to the cathodes of diodes 32 and 37.

Figure 3:
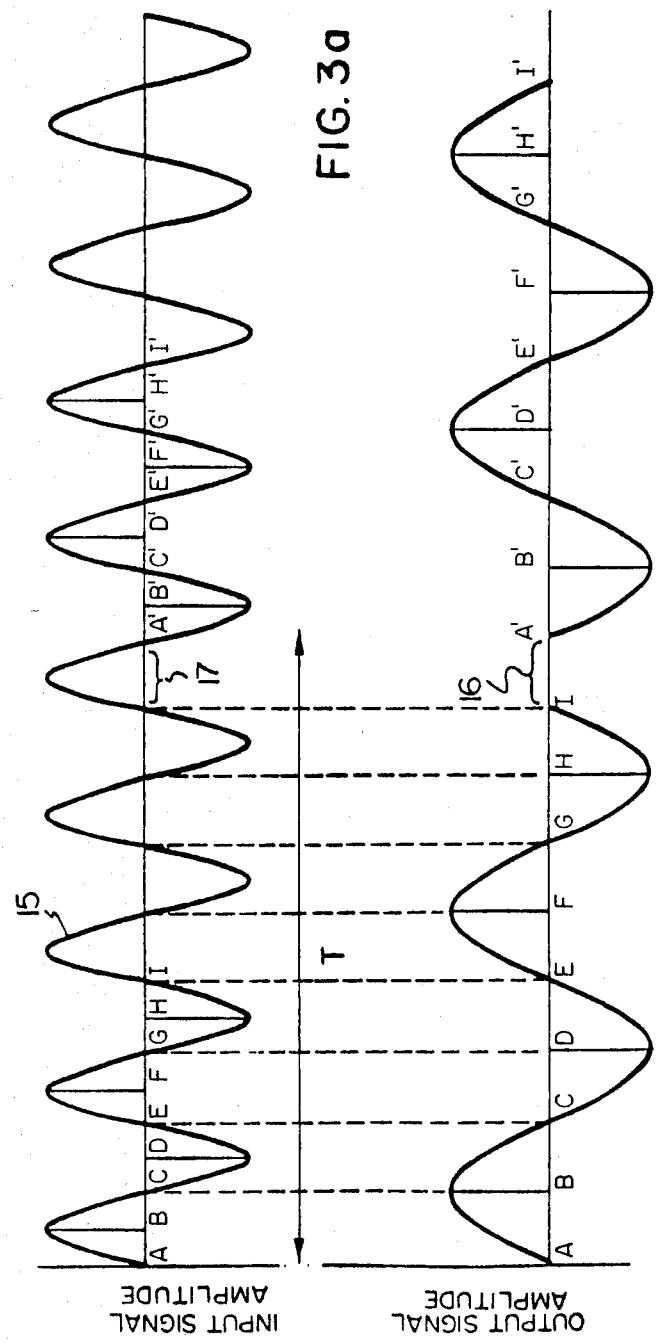
FIGS. 3a, 3b, 4a and 4b are waveform diagrams used to illustrate the invention.

It should be noted that each of the sampler and switching circuits 26a, 28a, 29a . . . 26n, 27n 28n referred to in FIG. 3 contains similar circuitry.

The anode of diode 39 and the cathode of diode 38 are both connected to the output leads of a pulse forming network 140. The network is comprised of a transformer having a center tapped secondary winding 40 and a primary winding 41. The center tap of winding 40 is connected to ground. The opposite leads of winding 40 are each connected through capacitors 42a and 43a and inductors 42b and 43b. One terminal of primary winding 41 is connected to ground and the other terminal is connected to a control source of read pulses.

The junctions between capacitors 42a and 43a and inductors 42b and 43b are the output leads of the pulse forming network 140. The output lead connected through inductor 42b to source of potential $+V_2$ is connected to the anode of diode 39, and the other output lead is connected to the cathode of diode 38. These output leads are similarly connected to corresponding diodes of sampler and switching circuits 26a-26n. Similar pulse forming networks 141 and 142 are respectively connected to the corresponding diodes of sampler and switching circuits 27a-27n, and sampler and switching circuits 28a-28n. Pulse forming network 140 is therefore adapted to switch circuits 26a-26n, pulse forming network 141 is adapted to switch sampler and switching circuits 27a-27n and pulse forming network 142 is adapted to switch sampler and switching circuits 28a-28n.

In operation, consider first sampler and switching circuit 26a. Initially, diodes 38 and 39 are in their forward conduction mode, since they are forward biased from source of potential $+V_a$, through inductor 42b, diode 39, resistor 35 to source of potential $-V_b$, and from source of potential $+V_b$, through resistor 34, diode 38, inductor 43b to source of potential $-V_a$.

A signal is received from input terminal 22 and is carried by the delay line through load 2 to ground. Accordingly a sample of the signal waveform appears as a potential at the junction of diodes 32 and 33. Since diodes 38 and 39 are forward biased, the anode junctions of diodes 33, 36 and 38 are nearly at potential $-V_a$, and the cathodes of 32, 37 and 39 are nearly at the potential $+V_a$. Clearly diodes 32 and 33, and 36 and 37 are reverse biased, and therefore are non-conductive.

A read pulse is now provided from control circuit 143, and passes down primary winding 41. Winding 40 inverts the pulse direction and during the period of the pulse, the junction of capacitor 42a and inductor 42b goes to a negative potential, and the junction of capacitor 43a and inductor 43b goes to a positive potential. This effectively reverse biases diodes 38 and 39, stopping conduction thereof. Diodes 32, 33, 36 and 37 become forward biased from potential $+V_b$ through resistor 34 and resistor 35 to potential $=V_b$. During this time period the input signal potential appearing at the junction of diodes 32 and 33 also appears at the junction between diodes 36 and 37, and is stored in capacitor 29a.

Once the read pulse applied to primary winding 41 of the transformer has been completed, diodes 38 and 39 become forward biased again, effectively shutting off conduction of diodes 32, 33, 36 and 37. Since the latter diodes are reverse biased, they are non-conductive, and the junction of diodes 36 and 37 is at high impedance with respect to ground. The charge on capacitor 29a, thus having a high impedance at the junction of diodes 36 and 37 and also at the input of buffer 44a, retains its charge and becomes an effective storage element.

The output leads of pulse forming network 140 are connected to all of sampler and switching circuit 26a–26n. Since the inputs thereto are all connected to taps of input delay line 1, and all are enabled from pulse forming network 140, all of the capacitors 29a–29n receive charges corresponding to samples at different portions of the input waveform form which is within the input delay line. The time of the read pulse applied to primary winding 41 thus establishes the read interval of the input waveform.

For the case in which the input waveform is longer than the delay line period, additional sampling and switching circuits 27a–27n, 28a–28n, etc. as described above are used. Let us assume for this explanation that the input waveform is 3 times the time period of the input delay line period. As the input signal passes down to line 1, and reaches load 2, a read pulse is applied by control 143 to primary winding 41 of the transformer connected to sampler and switching circuits 26a–26n. The corresponding samples of the first third of the input waveform are thus stored on capacitors 29a–29n as described above.

The second third of the input waveform passes down input delay line 1 and reaches load 2. At this time a second pulse is applied to pulse forming network 141. In a similar manner as described with respect to pulse forming network 140, sampler and switching circuits 27a–27n are enabled. Accordingly samples of the second third of the waveform appearat sampling points 24a–24n pass through sampling and switching circuits 27a–27n and are stored in capacitors 30a–30n.

The third third of the input signal waveform passes down input delay line 1, and a read pulse is applied to pulse forming network 142. Sampler and switching circuits 28a–28n thus become enabled, and the input signal waveform samples at sampling points 24a–24n pass through sampler and switching circuits 28a–28n and are stored in capacitors 31a–31n. The propagation delay between sampling points should correspond to a maximum of ½ wave-length of the highest input signal frequency to be processed.

It should be noted that inductors 42b, 43b and their equivalents in the other pulse forming networks isolate the d.c. voltage sources from the output leads. Secondary winding 40 is isolated from the d.c. voltage sources by capacitors 42a and 43a.

To read out the stored signal samples, output sampler circuits are used. Samplers 47a, 48a and 49a have their inputs respectively connected to the outputs of buffers 44a, 45a, and 46a, etc. Sampler circuits 47n, 48n and 49n have their inputs connected to the outputs of buffers 44n, 45n and 46n. The outputs of samplers 47a, 48a and 49a are connected together and to tap 50a on an output delay line 8.

Output delay line 8 has a delay time differing from delay line 1, and has taps at predetermined locations, i.e., tap 50a to tap 50n. Output delay line 8 has output terminal 11 at one end thereof, and is connected to load 9 at its other end. Samplers 47n, 48n and 49n have their outputs connected together to tap 50n of output delay line 8.

Pulse forming networks 144, 145 and 146 are connected between control circuit 143 and the sampler circuits just described. The latter pulse forming networks are similar to pulse forming networks 140, 141 and 142. The output leads of pulse forming network 144 are connected to the diodes of samplers 47a–47n which are similar to diodes 38 and 39 of sampler and switching network 26a. Similarly, the output leads of pulse forming network 145 are connected to samplers 48a–48n and the output leads of network 146 are connected similarly to sampler circuit 49a–49n.

The output sampler circuits operate similarly as the above-described sampler and switching circuits. For operation, control circuit 143 provides a write pulse first through pulse forming network 144. Accordingly samplers 47a–47n are enabled. The stored charge on capacitors 29a–29n thus can pass through buffers 44a–44n and samplers 47a–47n and appear at the taps 50a–50n of output delay line 8. The signal samples thus recreate the input signal, and with suitable filtering, a ripple-free analog output signal is provided. However, the output signal is shifted in frequency due to different delay characteristics of the output delay line from the input delay line.

Where signal portions are also stored on capacitors 30a–30n and 31a–31n, first samplers 47a–47n are enabled as described above. A following write pulse is applied to pulse forming network 145, which enables samplers 48a–48n. The charge stored on capacitors 30a–30n are then applied to taps 50a–50n in a similar manner as described above. Again, a write pulse is applied from control circuit 143 to pulse forming network 146, which enables sampler circuits 49a–49n. The signals stored by capacitors 31a–31n are thus applied to taps 50a–50n in a similar manner.

Clearly the three thirds of the input signal have been sequentially applied to all of the taps 50a–50n of the output delay line 8. Of course, the number of storage capacitors per delay line tap described herewith as three can be any suitable number.

It is preferred that buffers 44a–44n, 45a–45n and 46a–46n should have some gain, in order to cause the entire circuit to exhibit gain.

If there is some delay before output writing of the stored charges, the stored charges can be built up before dumping them into the output delay line. In this case rather than the buffers 44, 45 and 46, amplifiers should be used having high-current handling capabilities, while providing a high power output to the output delay line.

In addition, storage capacitors connected to the output of the buffers 44, 45 and 46 could be used to sustain a constant current drive during sampling.

In order to reduce the length of the input delay line, the high level period of the input pulses can be sampled, and the low level period not sampled, using appropriate control circuitry. The output pulse can be reconstructed completely by the timing of the outputing of the stored signal.

If we have a pulse signal having a duty cycle of 50% which is to be down-converted by a factor of 2, the input pulse signal may be completely sampled, amplified and reconstructed without introducing any phase discontinuities. The resultant down-converted output pulses will be twice as long as the input pulses. The output pulse width could of course also be limited if desired, e.g. to the input pulse width if the width of the input pulse is identified.

For up-conversion, the output pulse width of the signal is decreased by some factor while the frequency is increased by the same factor.

It should be noted that the sampling pulse signal carrying lines, connected to the sampling and switching gates, themselves have delay, which becomes evident at very high frequencies such as at gigahertz frequencies. The timing of the conductive lines must be taken into account. Alternatively, the delay lines can be lengthened or shortened to take this delay into account.

Operation of the circuit with respect to pulse signals is believed to be clear in view of the above description. A clearer understanding of the operation with respect to analog or continuous signals will be obtained by reference to the waveform diagrams and the description below.

In FIG. 3a, an input signal 15 is shown. The signal shows representative sample amplitudes at locations A-I, corresponding to nine input tap locations.

In FIG. 3b, the output sample amplitudes A-I are shown. Since the delay between samples A and B for a down-conversion of two is twice the period of the input sampling time, and since all of the input samples are applied to the output delay line virtually simultaneously, the time during which the output waveform is reconstructed being twice the waveform period of the input signal, the input need only be sampled once, rather than twice. Consequently sampling is shown only for one-half of the input waveform during the entire period of the output waveform. In general, the input signal need only be sampled at the output signal sampling frequency.

The effect of reconstructing a continuous output signal from a continuous input signal is shown in FIGS. 3a and 3b. Since the amplitude (or likewise the phase angle) of the last sampled point will not likely be the same as the sample voltage (phase angle) of the next first sample point, a phase discontinuity will occur in the output signal as shown by the time interval 16. A phase discontinuity may be introduced each time there is a block sample taken, i.e., at the inverse of the sampling frequency. This phase discontinuity characteristic may be of use in generating phase coded waveforms. Thus given a specific input frequency, a known output phase coded waveform may be created.

Figure 4:
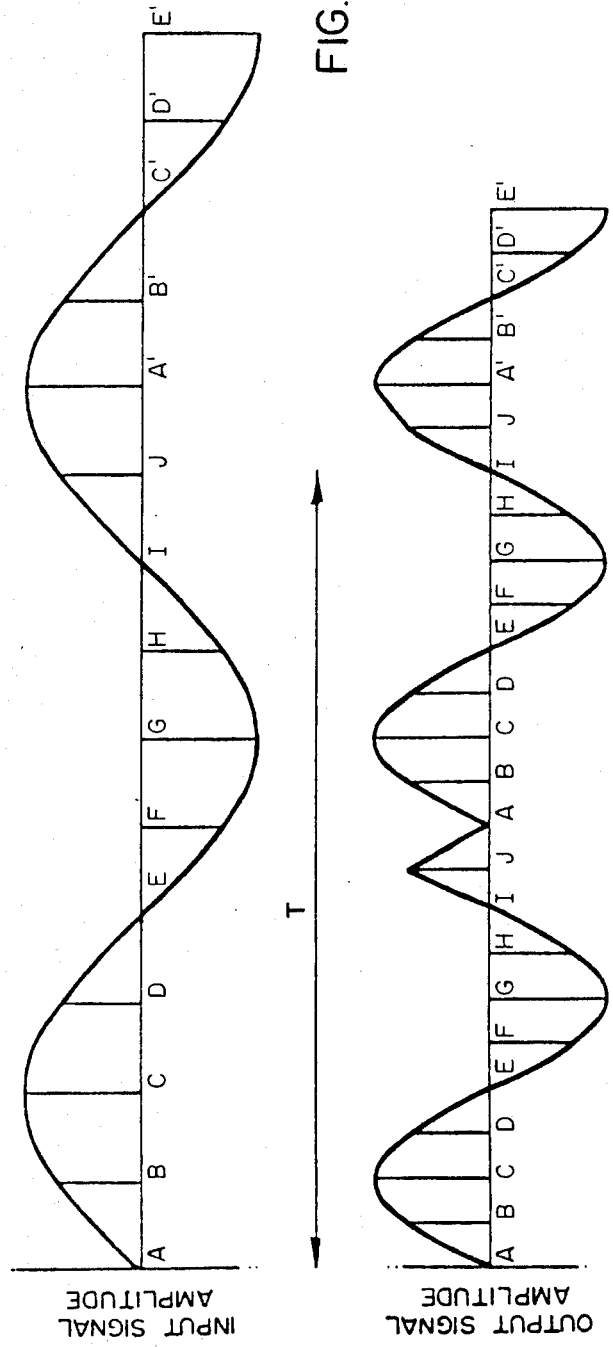

FIGS. 4a and 4b are input and output signals respectively for an up-converted signal. The input signal is sampled at e.g. ten tap points (A-J), resulting in ten voltage amplitude samples, correspondingly lettered in FIG. 4a. In this case twice during one input sample interval, output samples are applied to the output delay line, which is shown in FIG. 4b.

The amplitude of the last sampled point will not be the same as the sample voltage at the first sample point. This is illustrated in FIG. 4a by the amplitude at sample point J clearly being different from that of sample point A. The result is shown in FIG. 4b, in which a discontinuity exists between the amplitude of the sample at output sample point J and the immediately adjacent sample point A which signal immediately follows the signal amplitude at sample point J, since the input signal amplitudes are applied twice to the output delay line.

It should also be noted that the input sample point J and the following input sample point A' of FIG. 4a results in a small discontinuity between output sample point J immediately adjacent to output sample point A', in FIG. 4b.

An external filter circuit which does not form part of this invention may be desirable to smooth out the output signal from the output delay line. However it will be noted that the resulting output signal as between FIGS. 3a and 3b is a down-conversion, and as between FIGS. 4a and 4b is an up-conversion.

Figure 5:
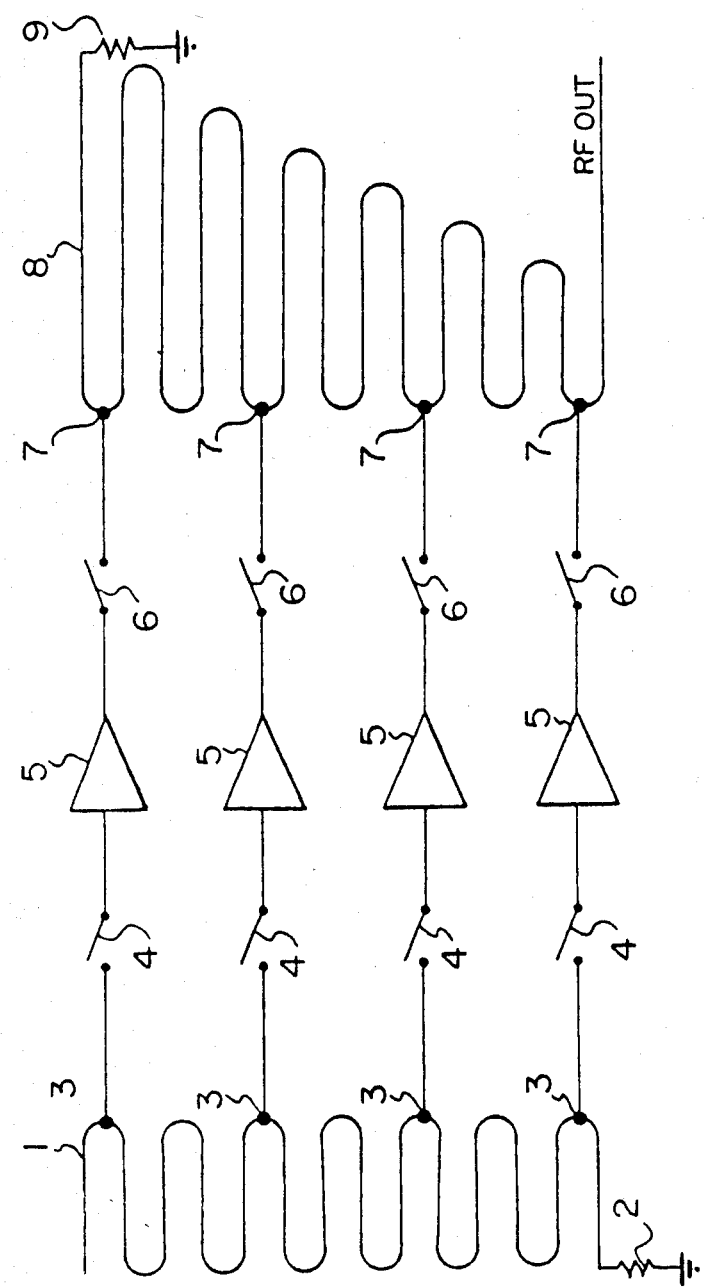
FIG. 5 is a block diagram illustrating the structure of a further embodiment of the invention in the form of a chirp signal generator.

FIG. 5 is a block diagram of a chirp signal generator. In this case the delay time of the output delay line varies from one end to the other according to a decreasing linear function.

As described with reference to FIG. 1, a radio frequency signal carried by input delay line 1 is sampled at first tap locations 3, the taps being applied via gates 4 to amplifiers 5. The resulting voltage samples are applied via output sampling gates 6 to second tap locations 7 of output delay line 8. For continuous output reconstruction, the sampling frequency of the output sampling gates is the inverse of the output delay line interval.

The structure shown in FIG. 5 provides a decreasing frequency chirp signal. However the structure could alternatively be made with decreasing delay, rather than increasing delay, to provide an increasing frequency chirp signal generator. Indeed, the delay of the output delay line can vary in accordance with any predetermined function, to obtain signals having a corresponding variation in frequency or phase with time. The use of a programmable delay line can also provide dynamic frequency shifts with time. Thus either a delay line having varying time delays or a programmable delay line can provide static or dynamic phase coding of an input signal. Dynamic frequency shifting or phase coding can also be provided by switching the output sample signal to different delay lines having different time delays connected to the same output.

In a working prototype of this invention, successful down-conversion of the input frequency was obtained by a factor of 1.92. The device operated over an input band of approximately 0–500 MHz, giving a corresponding output band of approximately 0–260 MHz.

The invention described herein provides a novel structure and method for changing the frequency of input signals. It has been found to be extremely wideband, and is capable of converting signals over an infinite number of conversion factors. The device is linear, thus facilitating the conversion of a plurality of signals simultaneously, without the generation of intermodulation products.

A person understanding this invention may now conceive of alternatives and variations, using the principles described herein. All are considered to be within the sphere and scope of this invention, as defined in the claims appended hereto.

What is claimed is:

1. A signal frequency converter comprising:
   (a) an input delay line for carrying an input signal, said input delay line including a plurality of taps;
   (b) first sampling means for sampling the input signal at first predetermined tap locations of the input delay line at first predetermined times;

(c) an output delay line having a plurality of second predetermined tap locations with different delay times between taps than the input delay line; and (d) second sampling means for applying the samples of the input signals to the second predetermined tap locations at second predetermined times to generate an output signal in said output delay line having a frequency different from the frequency of the input signal.

2. A signal frequency converter as defined in claim 1, in which the output delay line has a delay between tap locations longer than the delay of the input delay line between tap locations causing the output signal to be down-converted from the input signal.

3. A signal frequency converter as defined in claim 1, in which the output delay line has a delay between tap locations shorter than the delay of the input delay line between tap locations causing the output signal to be up-converted from the input signal.

4. A signal frequency converter as defined in claim 2 or 3, in which the sampling rate of the first sampling corresponds to the sampling rate of the output delay line.

5. A signal frequency converter as defined in claim 1, in which the frequency conversion factor is the ratio of the time delays between taps of the output delay line and the time delays between taps of the input delay line under simultaneous sampling conditions.

6. A signal frequency converter as defined in claim 1, in which the output delay line has delays between tap locations varying according to a predetermined function, to generate an output signal having a frequency varying in accordance with said function relative to the frequency of the input signal.

7. A signal frequency converter as defined in claim 1, in which the output delay line has a delay that changes linearly between adjacent tap locations.

8. A signal frequency converter as defined in claim 7 in which the sampling rate for the output delay line corresponds to the delay time of the output delay line.

9. A signal frequency converter as defined in claim 1, in which the signal carried by the input line is a continuous wave, further including means for time shifting successive sampling times of the second sampling means in accordance with a code to provide a phase code modulated output signal.

10. A method of frequency conversion comprising
(a) sampling an input signal having a first frequency with first time delays between samples;
(b) temporarily storing the samples of the input signal; and
(c) distributing the stored samples of the input signal in sequence with different time delays between samples than the first time delays to generate an output signal of different frequency than the input signal.

11. A signal frequency converter comprising:
(a) an input delay line for carrying an input signal, said input delay line having a plurality of first predetermined tap locations;
(b) an output delay line having a plurality of second predetermined tap locations with different delay times between taps than said input delay line;
(c) input sampling and switching means coupled to said input delay line for sampling an input signal;
(d) storage means for storing signals from said input sampling and switching means;
(e) output sampling and switching means coupled to said output delay line;
(f) buffer amplifier means coupled between said storage means and said output sampling and switching means for isolating said input means from effects of load impedance variations of said output means; and
(g) control means for applying read pulses for switching said input sampling and switching means to pass said input signal to said storage means and for applying write pulses for switching said output sampling and switching means to pass said stored signal through said buffer amplifier to said output delay line for transmission at a different frequency then said input signal.

* * * * *